United States Patent
Lane et al.

(10) Patent No.: US 6,583,224 B2
(45) Date of Patent: Jun. 24, 2003

(54) VINYL-TERMINATED POLYBUTADIENE AND BUTADIENE-STYRENE COPOLYMERS CONTAINING URETHANE AND/OR ESTER RESIDUES, AND THE ELECTRICAL LAMINATES OBTAINED THEREFROM

(75) Inventors: Scott Alan Lane, Eads, TN (US); Donald Clyle Rollen, Collierville, TN (US); Timothy Wayne Austill, Cordova, TN (US)

(73) Assignee: GIL Technologies, Collierville, TN (US)

( * ) Notice: Subject to any disclaimer, the term of this patent is extended or adjusted under 35 U.S.C. 154(b) by 0 days.

(21) Appl. No.: 09/984,461

(22) Filed: Oct. 30, 2001

(65) Prior Publication Data

US 2002/0045705 A1 Apr. 18, 2002

Related U.S. Application Data

(62) Division of application No. 09/432,055, filed on Nov. 1, 1999, now Pat. No. 6,333,384.
(60) Provisional application No. 60/106,875, filed on Nov. 2, 1998.

(51) Int. Cl.$^7$ .............................. C08F 8/30; C08F 36/06; B32B 3/02
(52) U.S. Cl. ..................... 525/124; 525/126; 525/127; 525/333.2; 525/333.7; 525/387; 526/302; 428/36.1; 428/36.2; 428/65.9; 428/416

(58) Field of Search ................. 525/124, 126, 525/127, 333.2, 333.7, 387; 526/302; 428/36.1, 36.2, 65.9, 416

(56) References Cited

U.S. PATENT DOCUMENTS

| 3,678,014 A | 7/1972 | Suzuki |
| 4,031,066 A | 6/1977 | Mori |
| 5,385,963 A | 1/1995 | McBain |
| 5,393,850 A | 2/1995 | Siebert |
| 6,306,963 B1 | 10/2001 | Lane et al. ................... 525/69 |

*Primary Examiner*—James J. Seidleck
*Assistant Examiner*—Olga Asinovsky
(74) *Attorney, Agent, or Firm*—Venable, LLP.; Marina V. Schneller

(57) ABSTRACT

Thermosetting polymers and the electrical laminates made therefrom are disclosed. The polymer comprises the cross-linked product of: a) one or more ethylenically unsaturated aromatic monomers, optionally containing a halogenated monomer to impart fire retardation, and b) a vinyl-terminated polybutadiene or butadiene-styrene copolymer containing either a urethane or an ester group. It has been discovered that an unexpected combination of thermal, electrical, and mechanical properties are obtained from the composition recited herein. The composition is ideally suited as a matrix polymer for electrical substrate applications.

2 Claims, No Drawings and BUTADIENE-STYRENE COPOLYMERS CONTAINING URETHANE AND/OR ESTER RESIDUES, AND THE ELECTRICAL LAMINATES OBTAINED THEREFROM This application is a divisional application of Ser. No. 09/432,055, filed Nov. 1, 1999 [now U.S. Pat. No. 6,333,384] which in turn claims priority to provisional application No. 60/106,875, filed Nov. 2, 1998, each of which is relied upon under 35 U.S.C. 120 and incorporated by reference herein.

BACKGROUND OF THE INVENTION

The invention relates to a thermosetting resin composition useful as a matrix resin for electrical substrate applications. The thermosetting polymers are characterized by exceptional adhesion to copper foil combined with excellent thermal and electrical performance. Moreover, in applications to metal substrates the cured thermosetting compositions exhibit excellent mechanical properties.

The combination of excellent thermal, electrical and mechanical (e.g. laminate bond strength) properties does not inhere in the compositions disclosed in the following U.S. patents. The composition disclosed in U.S. Pat. No. 5,223,568 to Landi et al. is described to be a thermosetting resin composition for making electrical substrate materials. In general, the composition is formed from 1) a polybutadiene or polyisoprene resin which is a liquid at room temperature and has a molecular weight less than 5,000 and 2) a solid butadiene or isoprene containing polymer capable of cross-linking with the former polybutadiene or polyisoprene resin. The solid butadiene or isoprene containing polymer is a thermoplastic elastomer block copolymer whose function in the composition is to improve the adhesion of the substrate to metal foil. The compositions according to this U.S. patent differ from the compositions of Landi et. al. in that they contain no ethylenically unsaturated monomers with a functionality less than two (2); by the phrase "functionality less than two" is meant that said monomer is characterized as having one double-bond or vinyl group. The patent does not specify ester or urethane chemical functionality(ies). Additionally, according to that U.S. patent, the method of manufacturing requires a high temperature cure condition at a temperature of greater than 250° C. and less than the decomposition temperature of the composition. These cure temperatures exceed the limitations of most commercially available and cost-effective equipment. The cure required by the thermosetting resins described herein, in accordance with the present invention, does not exceed 180° C.

U.S. Pat. No. 5,571,609 to St. Lawrence et al. describes an electrical substrate material similar to U.S. Pat. No. 5,223,568 except for the incorporation of woven glass fabric and particulate filler. The electrical substrates formed from those compositions perform poorly, in the respect that those compositions exhibit low peel bonds or low adhesion of the copper foil to the substrate. The St. Lawrence et al. U.S. Patent provides a composition which yields peel bonds that range from 2.1 to 5 pounds per inch width, (via test method IPC-TM-650 2.4.8 on one ounce per square foot copper foil). Adhesion of the copper foil (peel bond) in this range is marginal for many electrical substrate applications. Low peel bonds can cause subsequently fabricated electrical circuits to exhibit poor reliability and cause failures during high temperature soldering and reflow soldering operations. The peel bonds obtained by the inventive composition of this application typically exceed 10 pounds per inch width, (for one ounce per square foot copper foil).

U.S. Pat. No. 4,241,132 to Pratt et al. discloses a composition suitable for use as a matrix resin in an electrical substrate comprised of polybutadiene along with comonomers, such as styrene and the like. However, unlike the inventive composition of this application, Pratt et al. discloses that the composition is at least 50% by weight and preferably substantially pure polybutadiene. By comparison, as described below, the recited compositions of the instant application differ in that they must contain urethane and/or ester chemical functionality.

It is an object of this invention to provide a thermosetting resin composition that is particularly useful as a matrix resin for an electrical substrate and which can be used on commercially available high-speed processing equipment at temperatures of less than 250° C. To overcome the deficiencies of Landi et al., the thermosetting resin must cure at temperatures substantially less than 250° C. It has been discovered, that the composition recited in this application is compatible with high-speed cost-effective lamination processes, such as those in U.S. Pat. Nos. 4,587,161 and 4,803,022 both of Barrell et al., and does not require cure temperatures above 180° C.

Still another object of this invention is to provide a thermosetting composition that has a combination of both good glass transition temperature (the higher, the better) and good adhesion to the copper foil. It is widely known to those skilled in the art that as a thermosetting polymer increases in glass transition either by increasing the density of cross-links or decreasing the molecular weight between the cross-links, the polymer becomes more brittle. Brittle thermosetting polymers yield electrical substrates that have fabrication problems, (cracking and chipping of the substrate during milling and drilling operations). Also, as the polymer becomes more brittle, (i.e. looses toughness and impact strength), the adhesion of the copper foil decreases. Still another good example of this effect can be seen in epoxy based electrical substrates. As the epoxy composition is changed (by adding epoxy with functionality greater than two) to increase the glass transition temperature from 120° C. to 200° C., the copper adhesion drops from 12 to 8 pounds per inch width. It has been discovered, in accordance with the invention, that a specific combination of ingredients can yield peel bonds over 12 pounds per inch width (for one ounce per square foot copper foil) with very little decrease in glass transition temperature.

It is another object of this invention to provide a thermosetting resin composition with electrical properties suitable for use in high frequency applications. For a polymer dielectric to be suitable for use at broadband high frequencies, the dielectric constant must be stable over decades of frequency and over the environmental extremes of humidity and temperature. The thermosetting compositions and electrical substrates obtained therefrom exhibit these desirable features. The typical moisture absorption of the invented composition is typically less than 0.05% by weight, (weight gain after 24 hours at room temperature in water).

SUMMARY OF THE INVENTION

The thermosetting composition of the invention comprises 1) at least 50% by weight of at least one or more ethylenically unsaturated aromatic monomers (also designated below by the acronym "EUAM") having the formula

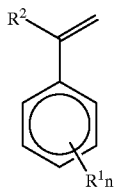

where $R^1$ represents a hydrogen, an alkene group of 2 to 3 carbon atoms; or alkyl groups of 1 to 4 carbon atoms and n=1; or where $R^1$ represents halogen atoms n=1 to 3 (1, 2, or 3), and $R^2$ represents a hydrogen atom or an alkyl group; and 2) from 1 to 50% by weight of a vinyl-terminated polymer (hereinafter also designated as "VTP") selected from the group of.
   a) a vinyl-terminated polybutadiene homopolymer containing a urethane group;
   b) a vinyl-terminated butadiene-styrene copolymer containing a urethane group;
   c) a vinyl-terminated polybutadiene homopolymer containing an ester group; and
   d) a vinyl-terminated butadiene-styrene copolymer containing an ester group.

The ethylenically unsaturated aromatic monomer (EUAM) at high weight percentages (>50%), provides a thermosetting resin composition with favorable electrical properties. As the level of EUAM is increased, the dielectric constant and dissipation factor is reduced. High speed digital applications for copper-clad circuit boards are favored by lower dielectric constant, while high frequency wireless communication applications for copper-clad circuit boards are favored by both lower dielectric constant and lower dissipation factor. Additionally, it has been discovered that as the level of halogenated styrene increases in total percentage of the EUAM component, the glass transition temperature of the cured resin unexpectedly increases and the composition is rendered fire retardant. For example, if the EUAM component were changed from entirely styrene to entirely dibromostyrene, the glass transition temperature of the resin would increase from about 100° C. to about 180° C. Higher glass transition temperatures are desirable for all copper-clad circuit board applications.

Thermosetting resins based upon 100% of the EUAM component do not make compositions favorable for copper-clad circuit board applications. While the electrical properties of such a composition are favorable, the mechanical properties, especially adhesion to copper foil, are extremely deficient. For example, a thermosetting composition comprising entirely dibromostyrene will have a favorable dielectric constant of 2.4 and dissipation factor of 0.002. However, the adhesion to copper foil by this resin composition will be less than 2 pounds per inch width for 1 ounce per square foot copper foil and the mechanical properties will be sufficiently low to cause substantial cracking problems during fabrication owing to the brittleness of the resin. Incorporating into the aforementioned 100% dibromostyrene composition about 10% of a urethane containing polybutadiene resin increases the adhesion to copper foil to over 10 pounds per inch width of 1 ounce per square foot copper foil with a negligible impact to electrical properties.

Moreover, thermosetting resins based upon 100% of the VTP component do not make compositions favorable for copper-clad circuit board applications. These cured resins suffer from very low glass transition temperatures and unfavorable electrical properties.

In accordance with this invention, the vinyl-terminated polymer contains either urethane or ester groups. Vinyl functional polybutadiene resins without the essential urethane or ester group and/or residues thereof, do not provide the desirable adhesion to copper foil. For example, 10% by weight of a pendant vinyl-functional polybutadiene resin (such as Ricon 152 from Ricon resins, Inc.) in 90% by weight of dibromostyrene yields a composition with adhesion to copper of only 2.3 pounds per inch width (on one ounce copper foil). A comparable composition with a vinyl-terminated polybutadiene containing a urethane group yields over 10 pounds per inch width adhesion to one ounce per square foot copper foil.

The invention provides thermosetting polymer with desirable electrical (specifically dielectric constant and dissipation factor) and adhesive properties which render the composition useful for many applications. Electrically insulating adhesives, printed circuit board substrates, radomes, microwave attenuating structures (such as focusing lenses), encapsulants, B-staged prepregs, and the like are good examples of potential applications for this composition.

DESCRIPTION OF THE PREFERRED EMBODIMENT

The invention thermosetting composition can be produced at cure temperatures below 250° C., and generally at temperatures no greater than 180° C. Actual temperature conditions fall within the range of 120 to 190° C. Cure temperatures above 200° C. can oxidize the polybutadiene resin and the copper foil utilized in the laminate if an inert atmospheres is not used (use of a inert atmosphere adds considerable cost.) A cure temperature >200° C. requires specialized and costly manufacturing equipment that have lower through puts (lower capacity and higher costs of product).

The resultant thermosetting compositions disposed on copper foil exhibit excellent mechanical properties peel bonds and excellent electrical properties. These compositions comprise 1) at least 50% by weight of one or more ethylenically unsaturated aromatic monomers (which are designated interchangeably below with the acronym "EUAM") having the formula:

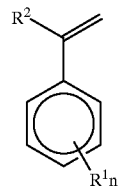

where $R^1$ represents a hydrogen, an alkene group of 2 to 3 carbon atoms; or alkyl groups of 1 to 4 carbon atoms; and n=1; or where $R^1$ represents halogen atoms n=1 to 3 (1, 2, or 3), and $R^2$ represents a hydrogen atom or an alkyl group of 1 to 2 carbon atoms; and 2) from 1 to 50% by weight of a vinyl-terminated polymer (VTP) selected from the group consisting of:
   a) a vinyl-terminated polybutadiene homopolymer containing a urethane group;
   b) a vinyl-terminated butadiene-styrene copolymer containing a urethane group;

c) a vinyl-terminated polybutadiene homopolymer containing an ester group; and d) a vinyl-terminated butadiene-styrene copolymer containing an ester group.

Examples of the EUAM component are styrene, brominated styrene (e.g. dibromostyrene), chlorinated styrene (e.g., mono, di, or tri chlorostyrene), α-methyl styrene, para-ethyl styrene, vinyl toluene, divinyl benzene and t-butyl styrene, ethyl vinyl benzene, meta-disopropenyl benzene, and para methyl styrene. It is preferred that some of the EUAM component be difunctional such as divinyl benzene or meta-diisopropenyl benzene) to improve the heat-resistance of the composition. The amount of difunctional monomer can range from 1 to 20% by weight of the total composition or 5 to 50% by weight of the EUAM component.

The EUAM component is at least 50% (by weight) of the composition. Higher percentages of EUAM are preferred due to the reduction of the dielectric constant and dissipation factor of the resultant resin. A most preferred range of EUAM is about 85 to 95% of the total weight of the resin composition. Additionally, it has been discovered that at these higher weight percentages of EUAM, it is preferred that a predominant portion of the EUAM component (40–100%) comprise halogenated ethylenically unsaturated aromatic monomer. Otherwise at the higher levels of EUAM, the exothermic cure reaction could yield voids in the cured resin, owing to the relatively lower boiling point of monomer.

It is an essential feature of this invention that the vinyl-terminated polymers (homopolymer or copolymer) contain either a urethane or an ester group. An example of a urethane containing vinyl-terminated polybutadiene resin would be a reaction product of a polybutadiene polyol with a vinyl-terminated isocyanate as illustrated by the following first equation:

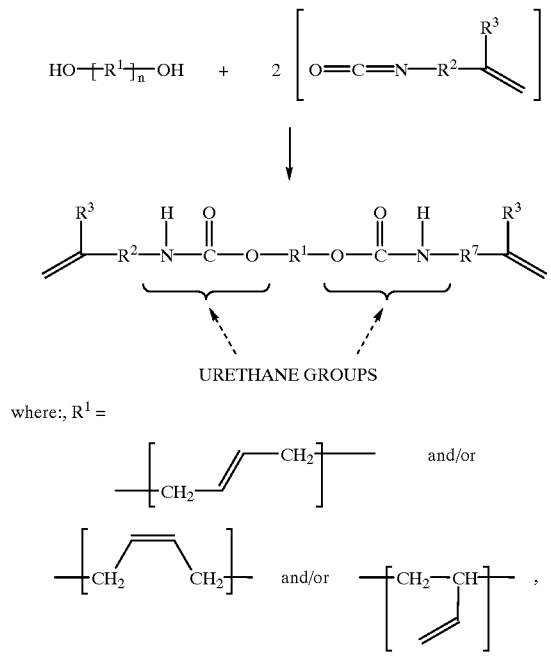

$R^2$ represents the residue from the specific vinyl terminated isocyanate, and $R^3$ represents a hydrogen or methyl group of carbon atoms. The $R^1$ substituents may be any combination of one or more residues from the polymerization of butadiene. The aforementioned reaction proceeds through well-known chemistry utilizing catalysis and temperatures known to those skilled in the art. Specific examples of a suitable polybutadiene polyol include the commercial products Poly bd® resins from Elf Atochem North America, Inc. A specific example of a suitable vinyl terminated isocyanate is a product from Cytec Industries, Inc., TMI® meta-unsaturated aliphatic isocyanate.

Alternatively, a urethane containing vinyl-terminated polybutadiene resin may be formed from the reaction product of a polybutadiene diisocyanate resin with a vinyl-terminated alcohol according to a reaction according to the second equation:

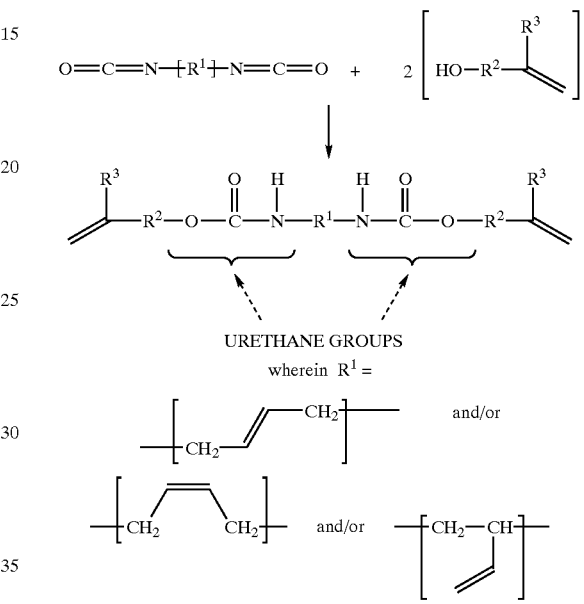

(i.e. $R^1$ represents the residues from the polymerization of butadiene), $R^3$ represents a hydrogen or methyl group of and $R^2$ represents the residue from the specific vinyl-terminated alcohol. The aforementioned reaction proceeds through well-known chemistry utilizing catalysis and temperatures known to those skilled in the art.

No polybutadiene diisocyanate resins are known to exist commercially. An example of a suitable vinyl terminated alcohol would be allyl alcohol.

An example of a urethane containing vinyl terminated butadiene-styrene copolymer is the reaction product of the reaction pathways described in Figure One or Two above, with the modification that:

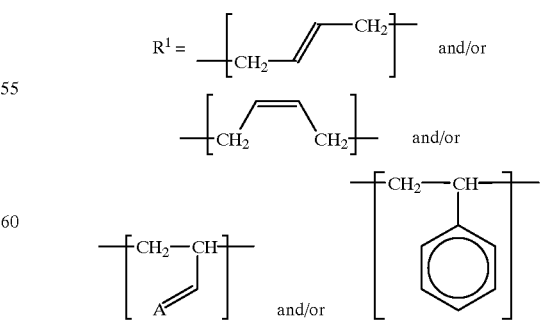

Here, the $R^1$ substituents may be one or more residues from the polymerization of butadiene and styrene.

A first example of an ester containing vinyl-terminated polybutadiene resin would be the reaction product of a vinyl-terminated epoxide with a carboxyl-terminated polybutadiene resin in accordance with the equation:

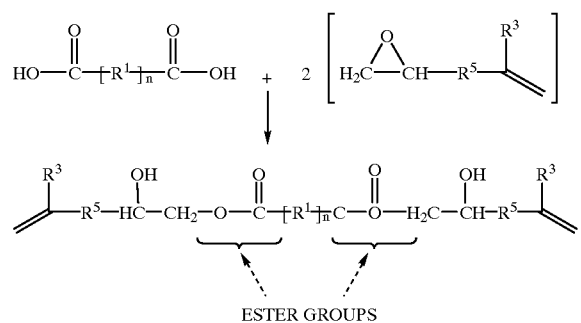

where $R^1 =$

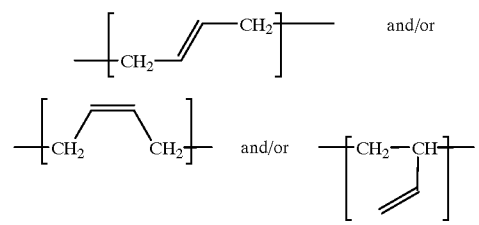

(i.e. $R^1$ represents the residues from the polymerization of butadiene), R represents a hydrogen or alkyl group, and $R^5$ represents the residue from the specific vinyl-terminated epoxide. An example of the carboxyl-terminated polybutadiene resin would be Hycar® from BFGoodrich Company. A suitable example of a vinyl-terminated epoxide would be glycidyl methacrylate.

A second example of an ester containing vinyl-terminated polybutadiene resin which could be prepared from the reaction product of an epoxy-terminated polybutadiene resin with a vinyl-terminated carboxylic acid is depicted in the following equation:

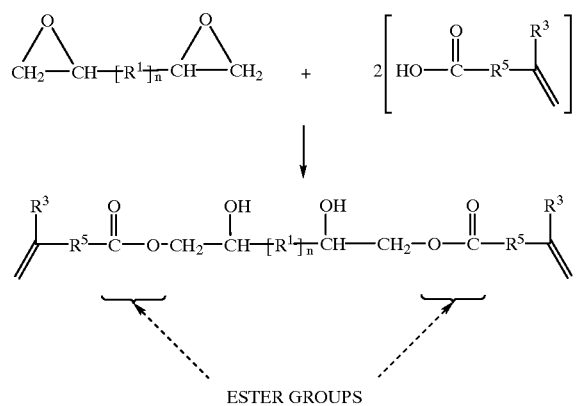

An example of a suitable epoxy-terminated polybutadiene resin would be a Hycar® product from BFGoodrich Company. An example of a suitable vinyl-terminated carboxylic acid would be methacrylic acid or acrylic acid. BFGoodrich Company also manufactures an ester containing vinyl-terminated polybutadiene resin named Hycar® 2000X168 which is believed to be manufactured by this method.

An example of an ester containing vinyl terminated butadiene-styrene copolymer would be the reaction product via one of the reaction pathways described in Figure Three or Four above, with the exception that:

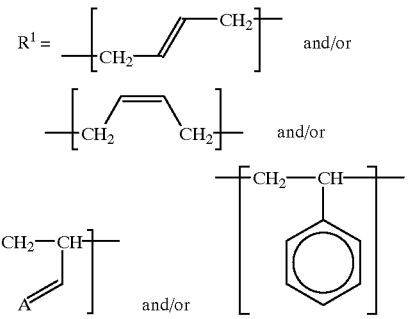

Here, the $R^1$ substituents may be one or more residues from the polymerization of butadiene and styrene.

Condensation esterification can be employed to prepare ester containing polybutadiene resins and butadiene-styrene copolymers from the esterification of hydroxyl functional polybutadiene resins or butadiene-styrene copolymers with a vinyl-terminated carboxylic acid. Suitable examples of the polybutadiene polyol include the PolyBd® products from Elf Atochem North America Inc., and the vinyl-terminated carboxylic acid includes methacrylic acid or acrylic acid and the like.

Compositions of the EUAM component with polybutadiene resins and styrene-butadiene copolymers minus the urethane and ester functionality in the ratios of this application lack critical properties for electrical laminate applications. A composition of EUAM with 50% by weight of a vinyl-functional butadiene resin (such as Ricon® 152 Resin from Ricon Resins, Inc., or other examples including Ricon® 150, Ricon(®) 154, Ricon® 153 and Ricon® 156 all from Ricon Resin Inc.) exhibit severely deficient peel bonds compared to the inventive compositions of this application. A similar composition with 10% by weight of the same resin in EUAM yields even lower peel bonds. All peels on the aforementioned example are on one ounce per square foot copper foil.

A composition of EUAM with 50% by weight of a vinyl-functional butadiene-styrene copolymer (such as Ricon® 100 from Ricon resins, Inc.) exhibit severely deficient peels of about 7 pounds per inch width compared to over 12 pounds per inch width for an ester containing vinyl-terminated butadiene-styrene copolymer at the same level, (all peels on one ounce per square foot copper foil).

The presence of the urethane and/or ester chemical functionalities is believed to modify the morphology of the resultant cured resin and therefore enhance the mechanical properties. In specific embodiments herein, the VTP contains an ester and/or urethane group per vinyl group. This is believed to be a result of the altered solubility of the ester or urethane containing polymers. This mechanism could form an interpenetrating polymer network with the EUAM component in the continuous phase and the VTP component in the discontinuous phase.

Curing or chemical cross-linking of the thermosetting inventive compositions can be accomplished by several methods, all well known to those skilled in the art. Incorporation of an organic peroxide, an azo compound, or any other free-radical source can cure these compositions. Suitable examples of organic peroxides include t-butyl peroctoate (preferably about 0.1 to 1.0% by weight of the composition), t-butyl peroxy benzoate (preferably about 0.1 to 1.0% by weight of the composition), benzoyl peroxide, methyl ethyl ketone peroxide, dicumyl peroxide and the like. If necessary, the curing rate can be controlled through the use accelerators or inhibitors.

Alternately the composition can be cured and cross-linked with radiation. Suitable examples include electron beam, ultra-violet, x-ray, or gamma ray irradiation. In the case of an UV cured composition, an UV initiator may be added. Additionally, the composition can be cured in the absence of peroxide with the application of heat. Exposure to temperatures of about 130° C. for one to twelve hours will cure and cross-link the composition.

Beyond the cure method chosen, it may be desirable to post-cure the product at an elevated temperature. Post curing at 170° C. for one hour may reduce the dissipation factor of the composition and improve peel bond. The post-cure step can be omitted if divinyl benzene is chosen as one of the EUAM components.

Additionally, it has been discovered that the composition can benefit from the incorporation of an anti-oxidant. In the absence of an anti-oxidant, the material will oxidize in the presence of atmospheric oxygen upon thermal aging and increase the dissipation factor slightly. For example, a cured composition of 90% by weight of EUAM component (where dibromostyrene is 100% of the EUAM component) with 10% by weight of a urethane containing vinyl-terminated polybutadiene resin will increase in dissipation factor by about 0.001 from 0.004 to 0.005 (in a 50% by weight e-glass reinforced laminate) if the exposed laminate is baked in a 170° C. convection oven for one hour. The only anti-oxidant found effective in eliminating the dissipation factor increase is triphenyl phosphite. The amount of triphenyl phosphite can range from 0.1% to 1%. Other specific phosphites and chemical classes (such as hindered phenols or amines) of anti-oxidants were found to be ineffective in eliminating this problem.

In addition to the aforementioned components, other ingredients may be added in order to modify a property specific to the application. Some of these additives are well known to those skilled in the art and may include rheology modifiers (such as fumed silica), fillers to modify the dielectric properties (such as silica, fused quartz, wollostonite, titania, and others which may be added to increase dielectric constant and/or reduce the dissipation factor), fillers to modify the thermal conductivity (such as boron nitride, levegated alumina, and others), polyunsaturated monomers (such as divinyl benzene and the like to increase the glass transition temperature), plasticizers (such as dioctyl phthalate and others to modify the mechanical properties), fire retardants (such as antimony compounds, halogenated materials, and the like), and others.

The amount of filler may range from 1% to 40%. This number range does not vary with type of filler; but it varies with particle size of filler used as smaller particle sizes yield higher viscosities and may be too great to impregnate glass.

The present invention further comprises electrical laminates utilizing the thermosetting resin compositions herein described in combination with fibrous reinforcements. Examples of suitable reinforcements include fibers of e-glass, c-glass, d-glass, quartz, ceramic, carbon, aramide, and other polymers.

The fibers can be incorporated into electrical laminates in many forms. Suitable forms include woven fabrics, chopped filaments, wet-laid or dry-laid veils, and the like. A preferred embodiment is an electrical laminate comprising a plurality of woven e-glass fabric impregnated with the inventive composition and subsequently cross-linked and cured. The amount of reinforcement filler may range from 15% to 60% by weight. This number range varies significantly with type of reinforcement and varies greatly if a combination of different types (i.e. woven and veil) are used.

The present thermosetting resin compositions can be utilized in existing cost-effective technologies to manufacture various types of electrical laminates. Examples of these technologies include, but are not limited to, continuous lamination, such as that described in U.S. Pat. No. 4,803,022 to Barrell et al. which is incorporated herein by reference; production of printed circuit boards, such as described in U.S. Pat. Nos. 4,671,984 and 4,751,146 to Masahiko Maeda et al. which are incorporated herein by reference; production of electrical laminates such as described in U.S. Pat. No. 4,336,297 to Yasuo Fushiki et al. and U.S. Pat. No. 5,009,949 to Kazuyuki Tanaka et al. which are both incorporated herein by reference; continuous belt press lamination, such as equipment offered by GreCon Corp; and traditional press or vacuum press lamination which is well known to those skilled in the art of manufacturing electrical laminates.

An electrical laminate of the present invention is preferably produced by infiltrating or impregnating at least one substrate or reinforcement, or multiple substrate or reinforcements, with a resin composition of the present invention to prepare a resin-infiltered or resin-impregnated substrates which are laminated by passage between rolls while removing interlaminar gas bubbles. Subsequently, the resultant laminate is heated with or without pressure, to cure the resin composition whereby the electrical laminate is obtained. Other cure mechanisms can be utilized. The electrical laminate of this invention can be continuously produced by such a method.

A copper-clad electrical laminate can be obtained by subjecting substrates impregnated with an uncured resin composition and copper foil to laminated molding to unite them into a body, or by inserting an adhesive between substrates impregnated with an uncured resin and copper foil and them subjecting them to laminated molding to unite them into a body. A copper-clad laminate can be obtained by also preparing a laminate by laminate molding and then unite this laminate and a copper-foil laminate in a body thorough an adhesive. Adhesives such as epoxy resins, polybutadiene resins, and the like can be used.

The present electrical laminates may be from about 0.001 to about 0.25 inches thick and may be clad on one or both sides or not clad in metal. A preferred embodiment is about 0.002 to about 0.20 inches thick. A more preferred embodiment is about 0.003 to about 0.120 inches thick.

Suitable cladding metals include aluminum, silver, gold, brass and most preferably copper. The metal cladding may be in various forms and weights. The weight may range from about 0.25 to about 5 ounces per square foot. The form may be any conventional type, such as foil, an electrodeposited layer or rolled annealed metal, such as for example, rolled annealed copper or electrodeposited copper foil. These conventional forms of metal cladding typically are treated on one or both sides with additional metal of the same or different types to promote increased adhesion to the laminate. The treatment can also include a silane-coupling agent to promote increased adhesion.

Another embodiment of the inventive composition would be a thin or thick film dielectric for high-density interconnect structures. In this application, the resin composition can be applied to a substrate as a liquid or as an unsupported partially cured thin or thick film. The liquid resin composition is applied using well known coating techniques, such as curtain coating, dipping, screen-printing, and the like. If a coating technique is employed that completely coats the substrate, the liquid composition may further comprise an ultra-violet (UV) cure initiator. After coating the substrate with the liquid, the resin composition is photo-imaged to selectively cure the resin, and the uncured resin is removed by dissolution in an appropriate solvent. Alternately, the substrate can be completely coated with resin composition, completely cured using one of the aforementioned cure techniques, and then the unwanted material can be removed by laser ablation.

A thick or thin film embodiment for high-density interconnect structures requires the inventive resin composition to be cast into a thin or thick film and partially cured, (via heat or other aforementioned method). The film is subsequently laminated via any well-known lamination technique (such as hot roll lamination) to a substrate. In this application, the composition further comprises a UV initiator, such that, after uniting with a substrate, the film is photo-imaged and selectively cured. Uncured film is subsequently removed with a suitable solvent.

Another embodiment for the inventive composition would be an adhesive or encapsulant that requires microwave transparency, heat resistance, and fire retardation. Such a material would be suitable in for high frequency communication applications, such as an adhesive for radome components, encapsulant for high frequency circuits, and the like.

A most preferred embodiment comprises an electrical laminate reinforced with 3 plies of style 1080 woven e-glass fabric, impregnated with the inventive composition, and clad on both sides with copper foil. The aforementioned laminate will have excellent high-frequency electrical properties, heat resistance, and may be flame retardant. Such a laminate is very suitable for subsequent processing as a circuit board, stripline or microstripline microwave component, and communication antennae and the like.

EXAMPLES OF THE INVENTION

All compositions recited in the examples were prepared by the following method:

1) The EUAM component(s) were added to a mixing vessel in the desired proportions.

2) The VTP resin component(s) and any other ingredients (s) were charged into a mixing vessel.

3) The ingredients were mixed with a Cowels blade on an air motor at moderate (≈1,000 rpm) speed for five minutes.

4) The initiator(s) (i.e. organic peroxides) were added to the composition while the air motor was operating at low speed (≈400 rpm) and mixed for ≈5 minutes. The composition is now ready for use.

The general lamination method for preparing the electrical laminates is as follows:

1) A layer of plastic release film (such as Mylar® from DuPont) of 1.42 mils thick was placed on an ¼ inch thick tempered glass plate of 1.00 by 1.00 feet. The dimensions of the film were large enough to protrude around the edges of the glass plate.

2) A one foot square piece of one ounce per square foot copper foil was placed treatment side up on the film.

3) A film of the inventive resin composition, prepared according to the to the present invention, was metered onto the copper foil by using 22 mil gauges and a wire-wound rod designed to provide a coating of the target thickness of the laminate. Wire-wound rods are well known throughout the coatings industry.

4) A layer of glass cloth, woven or nonwoven, was laid onto the resin film and allowed to saturate for approximately 2 minutes. If a plurality of layers were used, the layers were placed onto the resin film approximately 2 minutes apart to allow the resin mixture to saturate the glass.

5) An additional layer of copper foil, of the same size and weight as 2), was placed treatment side down on the laminate so as to align the edges with the first sheet of copper foil. This foil must be rolled on with a precisely milled bar to avoid porosity. See # 6 below.

6) A four inch diameter 16 inch long hollow steel cylinder (machined to provide uniform diameter and smooth finish) was placed at one edge of the laminate and gently rolled to the opposing edge while being forced by hand to ride on the gauges. As the cylinder moved across the laminate, the excess resin composition and entrained air bubbles were allowed to drain out of the laminate.

7) Another layer of release film, of the same size and dimensions as 1), was placed on top of the copper foil.

8) Two ½ inch wide by 12 inches long shims of the approximate laminate thickness were placed on opposing sides of the laminate on top of the carrier film, but still on the glass plate.

9) Another plate of glass of equivalent dimensions as 1), was placed on top of the laminate.

10) The glass-encased laminate was placed in a horizontal-opening press preheated to 220° F. under 10 psi for 20 minutes.

11) The laminate was removed from the press and placed in a forced-air convection oven at 350° F. for one hour to post-cure.

12) After post-cure, the laminate is removed from the oven and allowed to cool to room temperature.

Examples 1–9

The compositions of the weight percentages listed in Table 1 were prepared according to the aforementioned method. Three plies of woven e-glass fabric of style 1080 and 0.2 parts-per-hundred resin of dicumyl peroxide (organic peroxide initiator) was utilized to prepare an electrical laminate by the aforementioned lamination method. The properties of these laminates are detailed in Table 2.

TABLE 1

|  | Component | 1 | 2 | 3 | 4 | 5 | 6 | 7 | 8 | 9 |
|---|---|---|---|---|---|---|---|---|---|---|
| VTP | R45VT |  |  |  |  | 10% | 50% |  |  | 10% |
|  | Ricon 100 |  |  | 10% | 50% |  |  |  |  |  |
|  | Ricon 152 | 10% | 50% |  |  |  |  |  |  |  |
|  | VTB |  |  |  |  |  |  | 10% |  |  |
|  | VTBS |  |  |  |  |  |  |  | 10% |  |
| EUAM | DBS | 90% | 50% | 90% | 50% | 90% | 50% | 90% | 90% | 85% |
|  | DVB |  |  |  |  |  |  |  |  | 5% |

TABLE 2

| Property | 1 | 2 | 3 | 4 | 5 | 6 | 7 | 8 | 9 |
|---|---|---|---|---|---|---|---|---|---|
| Peel Bond AR | 1.5 | 2.2 | 2.3 | 3.0 | 10.0 | 10.9 | 7.0 | 5.5 | 7.6 |
| Peel Bond AS | 0.4 | 3.0 | 0.8 | 3.3 | 7.8 | 10.2 | 6.3 | 5.5 | 6.2 |
| Dk | 3.7422 | 3.6248 | 3.7824 | 3.6863 | 3.8885 | 3.7468 | 3.8750 | 3.7770 | 3.4558 |
| Df | .0033 | .0040 | .0035 | .0036 | .0038 | .0055 | .0044 | .0042 | .0043 |
| Tg (° C.) | 220 | 203 | 216 | 199 | 182 | 89 | 181 | 191 | 171 |
| Dielectric Thickness | 8.5 | 8.3 | 8.2 | 8.1 | 8.0 | 8.0 | 7.8 | 8.0 | 9.2 |
| Solder Stability | >180 | 105 | >180 | >180 | 87 | 154 | >180 | >180 | >180 |
| % Glass by weight | 46.36 | 55.35 | 47.34 | 54.89 | 46.90 | 56.24 | 49.97 | 48.61 | 34.56 |
| % Glass by volume | 35.53 | 36.38 | 36.83 | 37.28 | 37.75 | 37.75 | 38.71 | 37.75 | 24.62 |

TABLE 3

| Property | 1 | 2 | 3 | 4 | 5 | 6 | 7 | 8 | 9 |
|---|---|---|---|---|---|---|---|---|---|
| Dk | 2.433 | 2.266 | 2.419 | 2.292 | 2.496 | 2.337 | 2.435 | 2.370 | 2.586 |
| Df | .0023 | .0031 | .0025 | .0025 | .0027 | .0049 | .0035 | .0032 | .0035 |

NOTES:
Peel Bond is measured on 1 oz/ft$^2$ copper foil by test method IPC-TM-650
(Units = #/inch width) where AR = as-received and AS = after-solder immersion at 550° F.
for 20 seconds
Tg represents glass transition temperature as measured by dynamic mechanical analysis
(Perkin Elmer DMA7E) (Units = degrees Celsius)
Dk = dielectric constant and Df = dissipation factor as measured by Model 0501 Thin Sheet
Tester from Damaskos, Inc. at 2.12 GHz frequency
Dielectric thickness is in mils
Solder stability is dwell time in seconds at 550° F. before blistering or delamination
DBS represents dibromostyrene.
DVB represents divinyl benzene.
please complete the blanks
R45vt is a vinyl terminated polybutadiene homopolymer containing a urethane group from Elf Atochen.
RICON 100 is a vinyl terminated butadiene-styrene copolymer.
RICON 150 is a vinyl terminated polybutadiene homopolymer.
VTB is vinyl terminated polybutadiene homopolymer containing an ester group.
VTBS is vinyl terminated butadiene-styrene copolymer containing an ester group.

Table 3 gives the electrical properties of the neat resin compositions (i.e. containing no reinforcement) prepared according to the aforementioned method.

What is claimed is:

1. An electrical laminate, comprising a microwave circuit substrate, which comprises a copper support, and a cured thermosetting composition which is supported on said copper support and which comprises:

(a) from 20 to 90% by weight of one or more ethylenically unsaturated aromatic monomers having the formula:

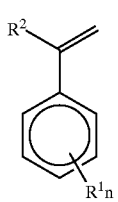

where $R^1$ represents a hydrogen, an alkene group or alkyl groups and n=1, or
    where $R^1$ represents halogen atoms n=1 to 3, and $R^2$ represents a hydrogen atom or an alkyl group;

(b) from 1 to 50% by weight of a vinyl-terminated polymer (VTP) selected from the group of:
        i. a vinyl-terminated polybutadiene homopolymer containing a urethane group
        ii. a vinyl-terminated butadiene-styrene copolymer containing a urethane group
        iii. a vinyl-terminated polybutadiene homopolymer containing an ester group
        iv. a vinyl-terminated butadiene-styrene copolymer containing an ester group (c) from 5 to 60% by weight of a woven fabric, and;
    (d) from 0.01 to 1% by weight of an organic peroxide.

2. The electrical laminate of claim 1, which is clad with metal foil on one or both sides.

* * * * *